United States Patent [19]

Jelks

[11] 4,278,710
[45] Jul. 14, 1981

[54] APPARATUS AND METHOD FOR SUBMICRON PATTERN GENERATION

[75] Inventor: Edward C. Jelks, San Diego, Calif.

[73] Assignee: The United States of America as represented by the Secretary of the Navy, Washington, D.C.

[21] Appl. No.: 69,654

[22] Filed: Aug. 27, 1979

[51] Int. Cl.³ .................... C23C 11/00; C23C 13/00
[52] U.S. Cl. .................................. 427/250; 118/720; 427/282
[58] Field of Search ............... 118/715, 720; 427/250, 427/255, 248 R, 282, 99, 248.1

[56] References Cited

U.S. PATENT DOCUMENTS

| | | | |
|---|---|---|---|
| 3,117,025 | 1/1964 | Learn et al. | 118/720 |
| 3,132,046 | 5/1964 | Mann | 118/720 |
| 3,326,718 | 6/1967 | Dill | 427/282 |
| 3,377,697 | 4/1968 | Hobbs | 427/250 |
| 3,719,487 | 3/1973 | Schutze et al. | 355/77 |
| 3,772,102 | 11/1973 | Tiemann et al. | 149/189 |
| 3,820,994 | 6/1974 | Lindberg et al. | 156/650 |
| 3,899,996 | 8/1975 | Park | 118/720 |
| 4,004,044 | 1/1977 | Franco et al. | 427/259 |
| 4,022,932 | 5/1977 | Feng | 427/259 |

OTHER PUBLICATIONS

IBM Technical Disclosure Bulletin, vol. 14, No. 3, pp. 772-773 "Evaporation Mask for Mask Changing and Registration Under Vacuum" Aug. 1971.
IBM Technical Disclosure Bulletin, vol. 5, No. 1, p. 5, "Vacuum Evaporation Method", Jun. 1962.

*Primary Examiner*—Ronald H. Smith
*Assistant Examiner*—S. L. Childs
*Attorney, Agent, or Firm*—Richard S. Sciascia; Edwin F. Johnston

[57] ABSTRACT

An apparatus and method are provided for depositing submicron patterns on a substrate. The apparatus includes an evaporative source located opposite the substrate so that molecules from the source can be deposited directly on the substrate. A mask is located between the evaporative source and the substrate, the mask having openings which correspond to the desired pattern to be deposited on the substrate. A plate is located between the mask and the substrate, the plate having an aperture for allowing evaporated molecules to be deposited on the substrate according to the pattern of the mask.

10 Claims, 14 Drawing Figures

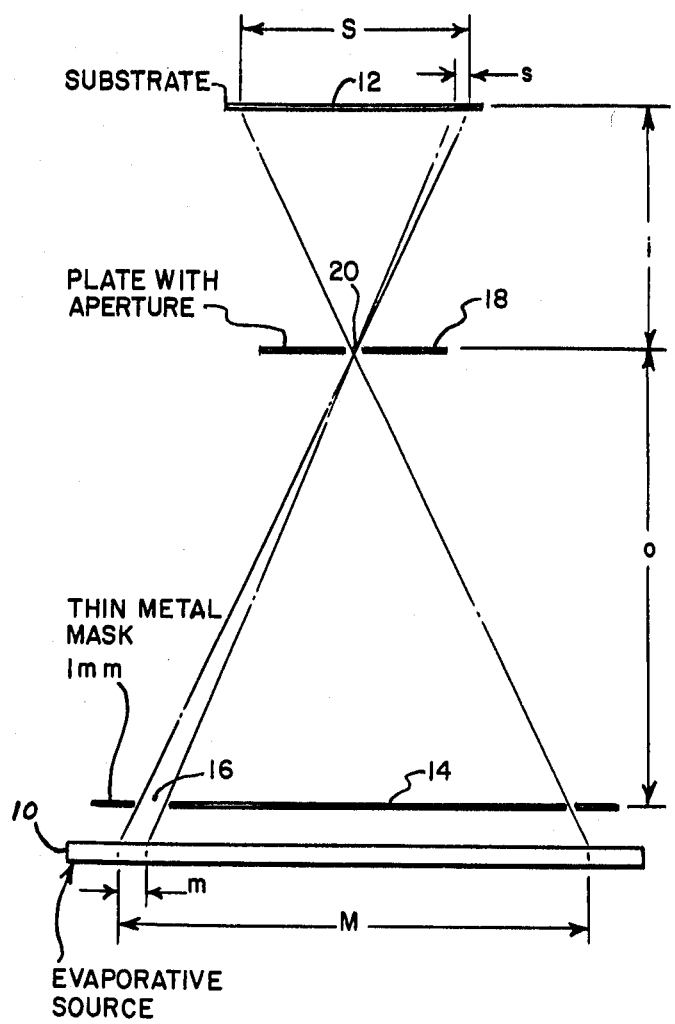
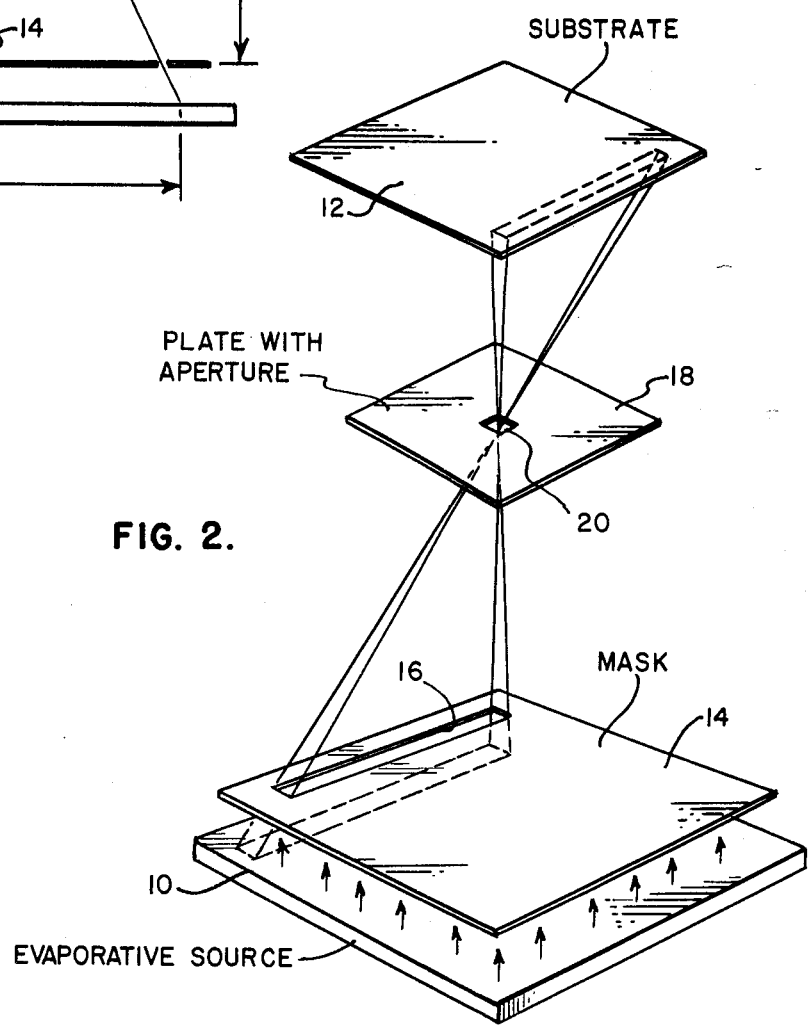
FIG. 1.
FIG. 2.

PROVIDE SUBSTRATE.

APPLY PHOTORESIST LAYER.

PLACE MASK AND EXPOSE PHOTORESIST.

REMOVE MASK AND REMOVE PHOTORESIST BY DEVELOPING EXPOSED REGION.

DEPOSIT Ti LAYER.

REMOVE PHOTORESIST ISLAND AND Ti ON TOP OF ISLAND.

OBLIQUELY APPLY SUCCESSIVE ETCH RESISTANT LAYERS OF Ti FROM PERPENDICULAR DIRECTIONS.

APPLY PHOTORESIST LAYER TO BOTTOM OF SUBSTRATE.

DISPOSE MASK AND EXPOSE PHOTORESIST.

REMOVE MASK AND CREATE APERTURE IN BOTTOM PHOTORESIST BY DEVELOPING.

ETCH Al OUT OF CIRCULAR REGION LEAVING SQUARE HOLE IN Ti LAYERS.

REMOVE PHOTORESIST.

4,278,710

APPARATUS AND METHOD FOR SUBMICRON PATTERN GENERATION

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The invention relates to an apparatus and method for directly depositing a submicron thin film pattern onto a substrate.

Methods for depositing integrated circuit patterns on a substrate invariably include a series of successive steps involving a photoresist layer on the substrate. One such method is the standard "liftoff" photolithography technique. This technique involves the preparation of a photoresist layer on the substrate by masking the photoresist layer, exposing the photoresist to light, and removing the exposed photoresist by developing. A source of metal can then be evaporated onto the photoresist, after which the photoresist layer is removed to leave the desired circuit pattern on the substrate. Other methods are the electron and ion beam techniques. In the electron beam technique an electron beam is moved according to a computer generated pattern so as to literally write on the photoresist layer a desired circuit pattern. The photoresist layer is then developed to remove the exposed regions and metal is deposited on the substrate. This method has three disadvantages, namely: (1) a considerable amount of time is required to implement the method, (2) it is hard to produce small patterns on the substrate, and (3) the edges of the pattern are rough. The ion beam technique ionizes a gas, such as Argon, and the positive ions thereof are utilized to bombard a previously prepared photoresist on an aluminum layer on a substrate. The ions will etch away the aluminum without effecting the photoresist. The photoresist is then removed to leave a pattern of aluminum which is normally quite sharp in detail. All of the aforementioned techniques involve intermediate steps which are time consuming.

SUMMARY OF THE INVENTION

The present invention involves an apparatus and method for directly depositing a thin film, which may be of submicron dimensions, onto a substrate. This has been accomplished by providing an evaporative source located opposite the substrate so that molecules from the source can be deposited directly thereon. A mask is located between the evaporative source and the substrate, the mask having openings which correspond to the desired pattern to be deposited on the substrate. A plate is located between the mask and the substrate, the plate having an aperture for allowing evaporated molecules to be deposited on the substrate according to the pattern of the mask. With this arrangement only a one step operation is required, namely evaporating molecules from a metal source through the mask in the plate directly on the substrate. Extremely fine lines (submicron) with sharp detail can be obtained by this method.

OBJECTS OF THE INVENTION

An object of the present invention is to provide an apparatus and method for directly depositing a thin film integrated circuit pattern onto a substrate.

Another object is to provide an apparatus and method for directly depositing a thin film integrated circuit pattern of submicron dimensions with sharp detail onto a substrate.

A further object is to provide an apparatus and method for overcoming the aforementioned problems associated with prior art pattern generation techniques.

Still another object is to provide an apparatus and method of generating integrated circuit patterns without the requirement of utilizing a photoresist layer.

Yet another object is to provide an apparatus which will accomplish a one step method of generating thin film circuit patterns on a substrate.

DESCRIPTION OF THE DRAWINGS

FIG. 1 is an elevational schematic view of the present invention.

FIG. 2 is an isometric view of the invention.

DESCRIPTION OF THE PREFERRED EMBODIMENT

Figure 3:
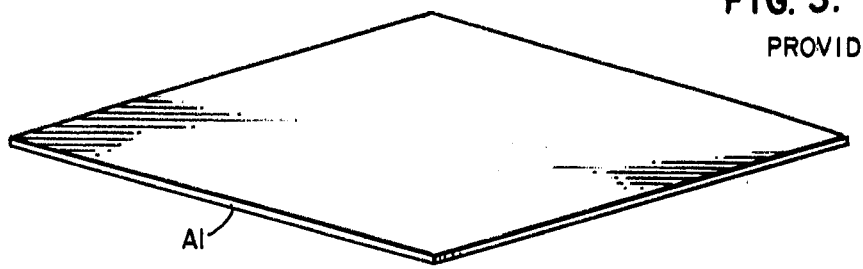
FIGS. 3 through 14 are isometric views of successive steps of the fabrication of a plate with a small aperture which is utilized in FIGS. 1 and 2 of the present invention.

Referring now to the drawings wherein like reference numerals designate like or similar parts throughout the several views there is illustrated in FIG. 2 an exemplary illustration of the present invention. An evaporative source, such as a pan crucible of aluminum 10 is located opposite a substrate 12 so that molecules from the aluminum source can be deposited in a vacuum directly on the substrate 12. A mask 14 is located between the evaporative source 10 and the substrate 12. A single enlarged opening 16 is shown in the mask 14 for illustration purposes. The mask in reality will have openings which correspond to the desired pattern which is to be deposited on the substrate 12. A plate 18 is located between the mask 14 and the substrate 12. The plate 18 has an aperture 20 for allowing evaporative molecules passing through the mask 14 to be deposited directly on the substrate 12 according to the pattern of the mask. It is important that the aperture be smaller than the smallest feature of the pattern to be generated on the substrate 12. The substrate 12 may be glass, the plate 18, which will be described in detail hereinafter, may be metal, and the mask 14 may also be metal. The mask may be prepared by machining or etching through a metal plate which may be one milimeter in thickness. With the technique described hereinbelow for constructing the plate 18 the aperture 20 therein will be square with submicron dimensions.

The method of the present invention involves evaporating molecules from the source 10 of metal opposite the substrate 12 so that the molecules of the metal will be directed toward the substrate. The mask 18 is interposed with an open pattern, such as opening 16, between the source 10 of metal and the substrate 12 so that molecules of metal will be directed through the open pattern toward the substrate 12. The plate 18 with a small aperture, such as the square aperture 20, is interposed between the mask 14 and the substrate 12 so that all metal molecules have to pass through the aperture 20 after they pass through the open pattern in the mask 14. With this arrangement metal molecules from the evaporative source 10 will be deposited directly on the substrate 12 in the pattern of the openings of the mask 14. This method is analogous to the operation of a pinhole camera, and it is obvious that the pattern of the mask 14 will be inverted on the substrate 12 because of the passage of the rays through the aperture 20 in the plate 18.

FIG. 1 illustrates various dimensions of the components of the present invention as well as the distances therebetween. If o is the distance between the aperture 20 and the mask 14, and i is the distance between the aperture 20 and the substrate 12, the pattern reduction factor is O/i. Typical dimensions for the operation of the invention may include: $M=2$ cm., $m=0.02$ cm, $o=40$ cm, and $i=0.1$ cm. This will result in a pattern on the substrate 12 of maximum linear dimension $S=50$ micrometers and a feature size $s=0.5$ micrometer. In this calculation one would have to compensate for the finite size of the aperture 20.

Figure 4:
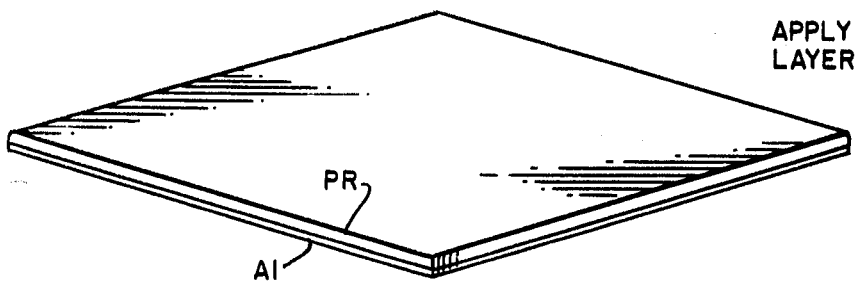
Figure 5:
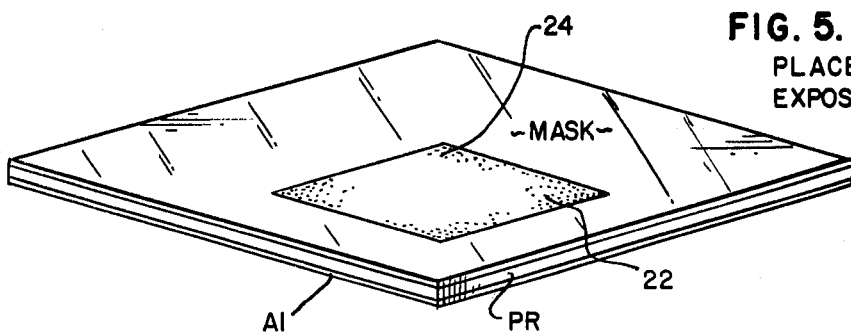
Figure 6:
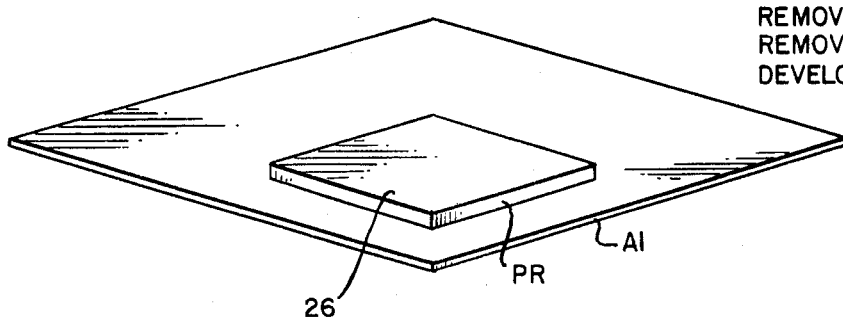
Figure 7:
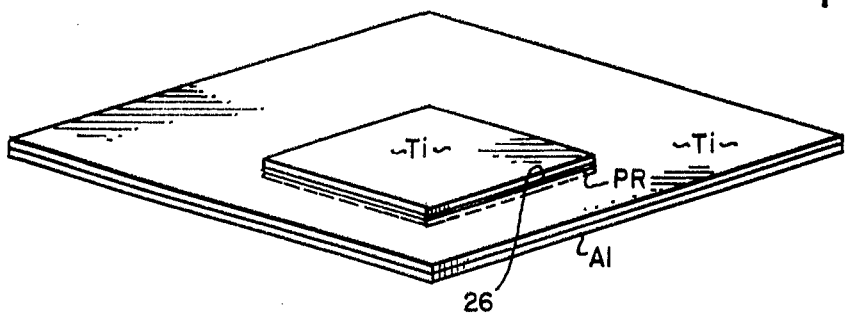
Figure 8:
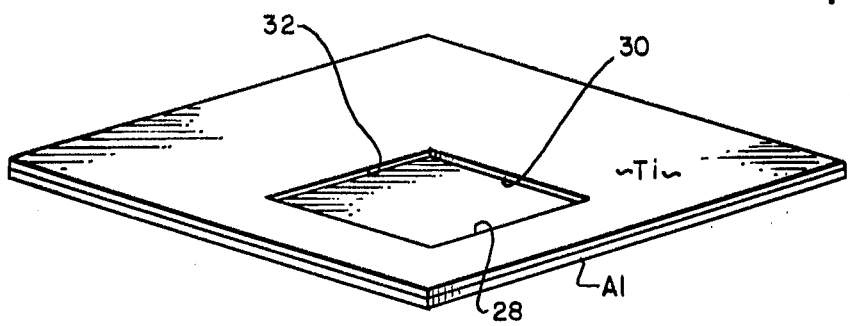

One of the key elements in the practice of the invention illustrated in FIGS. 1 and 2 is the plate 18 with the very small aperture 20. The fabrication of such a plate is illustrated in FIGS. 3 through 14. As illustrated in FIG. 3, the first step in such a fabrication is the provision of a substrate such as a thin plate of aluminum. As illustrated in FIG. 4, a photoresist layer may be formed on top of the aluminum substrate. The photoresist may be deposited on the aluminum substrate and then the substrate spun in a centrifuge to form the photoresist layer. In FIG. 5 a mask is placed on top of the photoresist layer. In the preferred embodiment the mask has a square configured opaque portion 22 which has a corner section 24 which overlies the center of the aluminum substrate. After the mask is placed the photoresist layer is exposed to light, such as ultraviolet light. As illustrated in FIG. 6, the mask is then removed and the photoresist which has been exposed to light is removed by developing. This then leaves a photoresist island 26. As illustrated in FIG. 7, a metal, such as titanium, is perpendicularly deposited on the aluminum substrate. The thickness of the titanium layer should be slightly less than the thickness of the photoresist island 26 so that a small thickness of the photoresist layer is left exposed. This then enables a solvent to remove the photoresist as well as the titanium on top of the island, as illustrated in FIG. 8. As can be seen from FIG. 8, this then leaves a well 28 in the deposited layer of titanium on top of the aluminum substrate.

Figure 9:
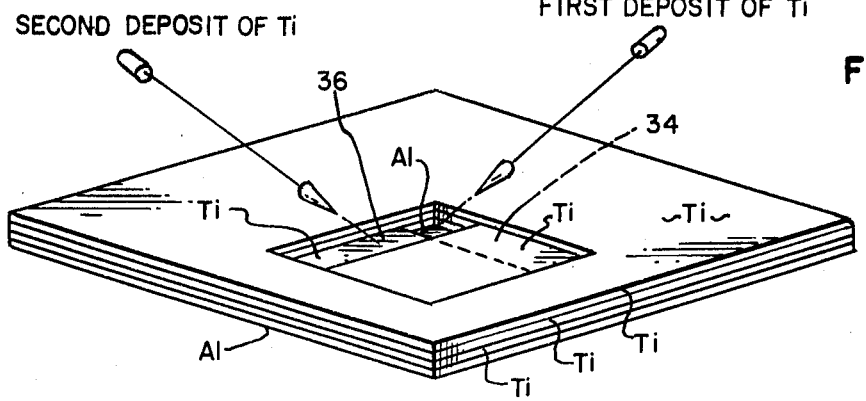

The next important step in the fabrication of the plate 18 with the small aperture 20 is illustrated in FIG. 9. As illustrated in FIG. 9 first and second deposits of a metal, such as titanium, are deposited at 90° with respect to one another and obliquely to the aluminum substrate with each deposition uniformly overshooting respective edges 30 and 32 of the well (see FIG. 8). With this arrangement the first deposit of titanium will deposit a layer of titanium across the entire substrate except for a rectangular area 34 which is caused by shadowing by the well edge 30. The second deposit of titanium will form a subsequent layer of titanium over the entire substrate except for a rectangular area 36 which is caused by shadowing by the well edge 32. The result is a small no deposit square hole area in the well 28 which is directly above the center of the aluminum substrate.

Figure 10:
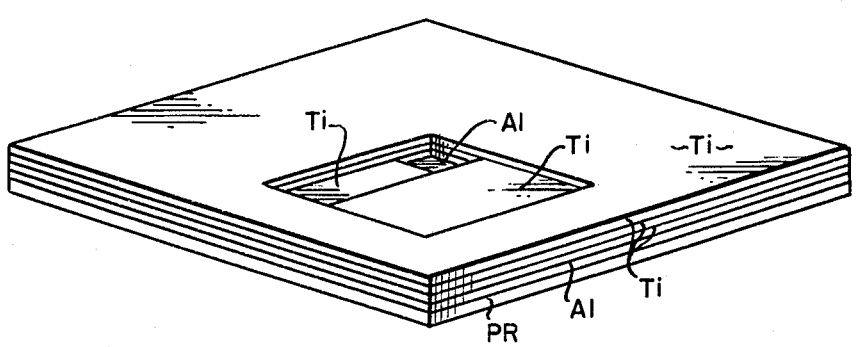
Figure 11:
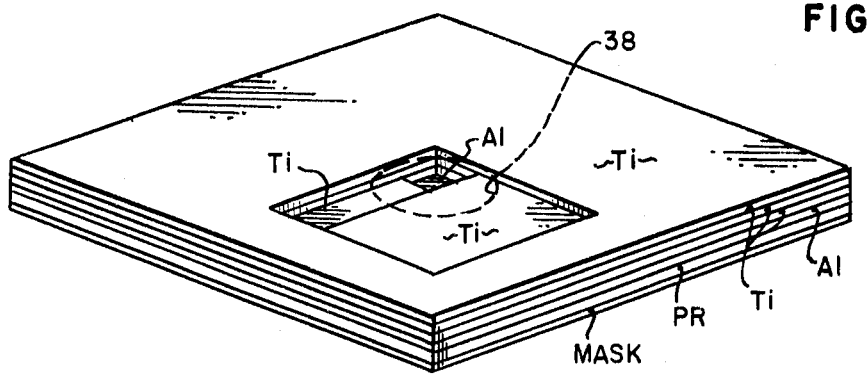
Figure 12:
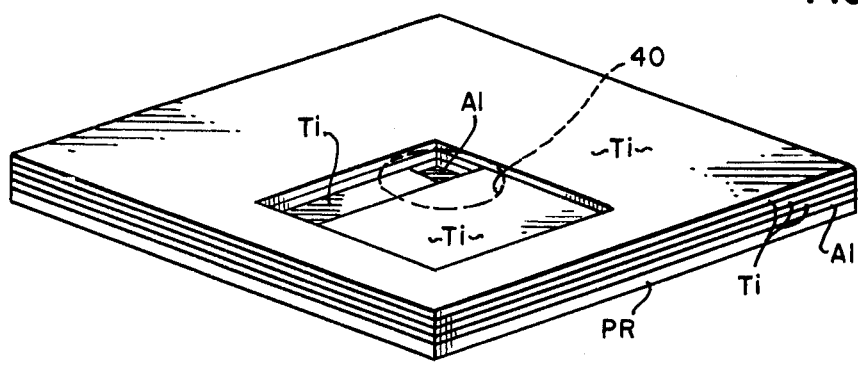
Figure 13:
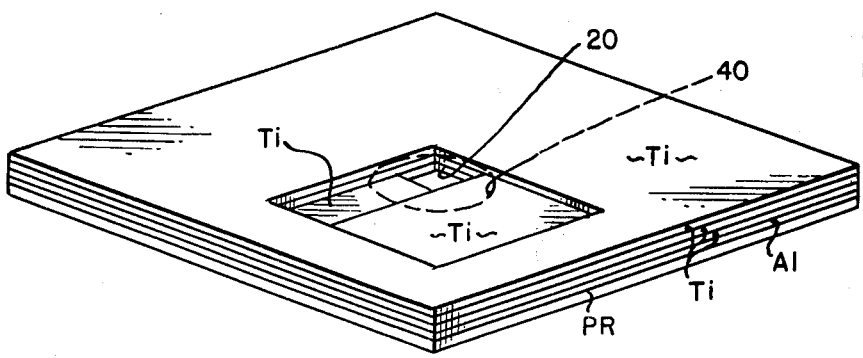
Figure 14:
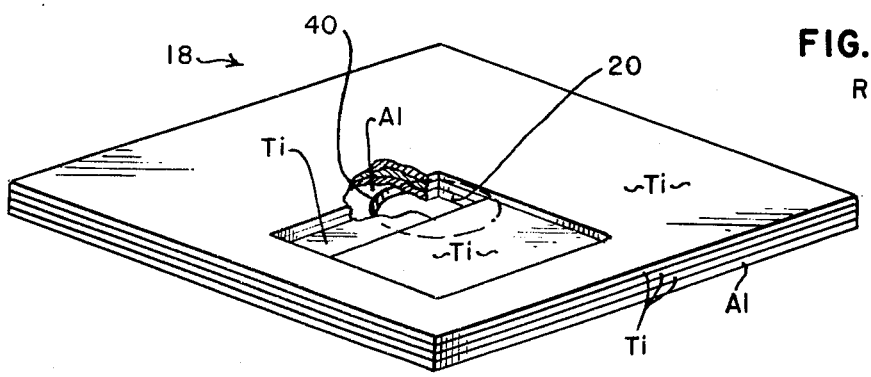

The next step is to apply a photoresist layer to the bottom of the aluminum substrate, as illustrated in FIG. 10. This photoresist layer may be applied by the spin technique described hereinabove. As illustrated in FIG. 11, a mask is then placed on the bottom of the photoresist layer. The mask is entirely opaque except for a center circular portion 38 which underlies the center square hole in the well. The bottom photoresist layer is then exposed to light through the mask. As illustrated in FIG. 12, the mask is removed and an aperture 40 is created in the bottom of the photoresist layer by developing. After this step only the small corner portion of the aluminum substrate is left exposed from its top and bottom sides. As illustrated in FIG. 13, the next step is to etch completely through the aluminum substrate in the area of the circular region 40 so that the square hole in the titanium layers now becomes a square opening 20. FIG. 14 shows the completed plate 18 after removal of the photoresist. A very small square opening 20 of submicron dimensions remains, and the layers of titanium which form the square opening are broken away to show the underlying aluminum substrate with its circular opening 40. The plate 18 with the very small opening 20 will now accomplish the objectives of the present invention illustrated in FIGS. 1 and 2.

Obviously, many modifications and variations of the present invention are possible in the light of the above teachings, and, it is therefore understood that within the scope of the disclosed inventive concept, the invention may be practiced otherwise than specifically described.

What is claimed is:

1. An apparatus for depositing submicron patterns on a substrate comprising:
    an evaporative source located opposite the substrate and spaced therefrom so that molecules from the source can be deposited directly on the substrate;
    a mask located between the evaporative source and the substrate and spaced therefrom, said mask having openings which correspond to the desired pattern to be deposited on the substrate; and
    a plate located between the mask and the substrate and spaced therefrom, said plate having an aperture for allowing evaporated molecules to be deposited on the substrate according to the pattern of said mask.

2. An apparatus as claimed in claim 1 including:
the largest distance across the aperture in the plate being less than one micron.

3. An apparatus as claimed in claim 2 including:
the aperture in the plate being substantially square.

4. An apparatus as claimed in claim 1 including:
the substrate.

5. An apparatus as claimed in claim 4 including:
the largest distance across the aperture in the plate being less than one micron.

6. An apparatus as claimed in claim 5 including:
the aperture in the plate being substantially square.

7. An apparatus as claimed in claim 6 including:
the evaporative source being a pan of aluminum; and the plate and the mask being metal.

8. A method of depositing submicron patterns on a substrate comprising the steps of:
    evaporating molecules from a source of metal opposite the substrate so that the molecules of metal will be directed toward the substrate;
    interposing a mask with an open pattern between the source of metal and the substrate so that molecules of metal will be directed through the open pattern toward the substrate; and further interposing a plate with a small aperture between the mask and the substrate so that all metal molecules have to pass through said aperture, whereby metal molecules will be deposited directly on the substrate in the pattern of the openings on the mask.

9. A method as claimed in claim 8 including:

the step of interposing the plate with a small aperture includes the aperture being square with its largest dimension being less than one micron.

10. A method as claimed in claim 9 including:

the distance between the plate and the substrate being less than the distance between the plate and the mask.

* * * * *